United States Patent
Suto et al.

(10) Patent No.: US 9,773,954 B2
(45) Date of Patent: Sep. 26, 2017

(54) LIGHT EMITTING DEVICE AND METHOD OF MANUFACTURING LIGHT EMITTING DEVICE

(71) Applicants: CITIZEN ELECTRONICS CO., LTD., Fujiyoshida-shi, Yamanashi (JP); CITIZEN HOLDINGS CO., LTD., Tokyo (JP)

(72) Inventors: Yuki Suto, Fujiyoshida (JP); Jo Kinosita, Fujiyoshida (JP)

(73) Assignees: Citizen Electronics Co., Ltd., Fujiyoshida-shi (JP); Citizen Watch Co., Ltd., Tokyo (JP)

( * ) Notice: Subject to any disclaimer, the term of this patent is extended or adjusted under 35 U.S.C. 154(b) by 0 days.

(21) Appl. No.: 14/965,290

(22) Filed: Dec. 10, 2015

(65) Prior Publication Data

US 2016/0172550 A1 Jun. 16, 2016

(30) Foreign Application Priority Data

Dec. 11, 2014 (JP) .................................. 2014-251254

(51) Int. Cl.
| | |
|---|---|
| *H01L 33/50* | (2010.01) |
| *H01L 25/075* | (2006.01) |
| *H01L 33/48* | (2010.01) |
| *H01L 33/60* | (2010.01) |
| *H01L 33/56* | (2010.01) |
| *H01L 23/00* | (2006.01) |

(52) U.S. Cl.
CPC ............ *H01L 33/504* (2013.01); *H01L 24/97* (2013.01); *H01L 25/0753* (2013.01); *H01L 33/486* (2013.01); *H01L 33/56* (2013.01); *H01L 33/60* (2013.01); *H01L 2224/13* (2013.01); *H01L 2924/0002* (2013.01); *H01L 2933/005* (2013.01); *H01L 2933/0033* (2013.01); *H01L 2933/0041* (2013.01); *H01L 2933/0058* (2013.01)

(58) Field of Classification Search
CPC ......... H01L 25/0753; H01L 2933/0033; H01L 2933/0041; H01L 2933/005; H01L 2933/0058; H01L 33/486; H01L 33/504; H01L 33/56; H01L 33/60
USPC ....................................... 257/89, 98; 438/27
See application file for complete search history.

(56) References Cited

U.S. PATENT DOCUMENTS

| | | | | |
|---|---|---|---|---|
| 2009/0101897 | A1* | 4/2009 | Murphy | .................. H01L 23/60 257/48 |
| 2010/0270579 | A1* | 10/2010 | Jo | ........................... H01L 33/20 257/99 |
| 2011/0095310 | A1* | 4/2011 | Komatsubara | ...... H01L 25/0753 257/88 |

(Continued)

FOREIGN PATENT DOCUMENTS

| | | |
|---|---|---|
| JP | 2007-208136 | 8/2007 |
| JP | 2007-220942 | 8/2007 |

*Primary Examiner* — Jonathan Han
(74) *Attorney, Agent, or Firm* — RatnerPrestia

(57) ABSTRACT

A light emitting device includes a light emitting element including electrodes on its under face, a phosphor cover attached to the light emitting element so as to cover a top face and a side face of the light emitting element, and a reflection frame including a side face holding periphery of the phosphor cover and a tilted face tilting from the side face to the outside and upward.

8 Claims, 9 Drawing Sheets

(56) References Cited

U.S. PATENT DOCUMENTS

| | | | | |
|---|---|---|---|---|
| 2011/0291143 A1* | 12/2011 | Kim | ........................ | H01L 33/56 |
| | | | | 257/98 |
| 2011/0316025 A1* | 12/2011 | Kuzuhara | ............. | H01L 33/504 |
| | | | | 257/98 |
| 2012/0007130 A1* | 1/2012 | Hoelen | ................. | H01L 33/504 |
| | | | | 257/98 |
| 2015/0221830 A1* | 8/2015 | Kim | ...................... | H01L 33/486 |
| | | | | 257/98 |

\* cited by examiner

LIGHT EMITTING DEVICE AND METHOD OF MANUFACTURING LIGHT EMITTING DEVICE

CROSS-REFERENCE TO RELATED APPLICATIONS

This application is based upon and claims the benefit of priority of prior Japanese Patent Application No. 2014-251254, filed on Dec. 11, 2014, the entire contents of which are incorporated herein by reference.

TECHNICAL FIELD

Embodiments discussed in the present specification relate to a light emitting device having a semiconductor light emitting element and a method of manufacturing a light emitting device.

BACKGROUND

In recent years, a semiconductor light emitting element such as an LED (Light-Emitting Diode) is becoming larger as brightness is becoming higher, and a semiconductor light emitting element of a size of about 1 mm×(0.5 to 1) mm is practically used. A light emitting device obtained by packaging such a semiconductor light emitting element with resin or the like is being developed. In some cases, such a light emitting device is referred to as a chip size package (hereinbelow, referred to as CSP) to directly represent the size of a semiconductor light emitting element. Since the mounting area of a CSP is small, necessary members are included in a CSP, and required brightness can be easily obtained by changing the number of CSPs, flexibility of designing of a lighting device or the like can be improved by using a CSP.

Japanese Laid-open Patent Publication No. 2007-208136 describes a light emitting device including a substrate having a wiring pattern, a light emitting element electrically connected to the wiring pattern, and a phosphor-containing resin provided so as to cover only the top and side faces of the light emitting element. The substrate has a recess for housing the light emitting element and the phosphor-containing resin is disposed so as to be apart from the side and bottom faces of the recess. The recess has a tilted face whose width increases toward the upside from the top face of the light emitting element, and a reflection member is provided to cover the tilted face.

Japanese Laid-open Patent Publication No. 2007-220942 describes a light emitting device including a substrate on which a wiring pattern is formed, a light emitting element connected to the wiring pattern by a wire, a phosphor part sealing the light emitting element by a phosphor-containing resin, and a reflection frame surrounding the periphery of the phosphor part. The reflection frame has a tilted face which is formed so that an opening surrounding the periphery of the phosphor part gradually expands toward a main light outgoing direction and which reflects light from the phosphor part. The reflection frame is formed so that the ridge line of the main face of the phosphor part is positioned on the extension of the tilted face. The reflection frame is formed using the part from the lower end of the tilted face to the substrate as a wall face part, and the tilt of the wall face part with respect to the substrate is larger than an angle formed with the substrate when the tilted face is extended and is equal to or less than perpendicularity.

SUMMARY

In the light emitting device described in Japanese Laid-open Patent Publication No. 2007-208136, providing the light emitting element so that the phosphor-containing resin is apart from the side and bottom faces of the recess in the substrate prevents breakage of the connection part between the light emitting element and the wiring pattern formed on the substrate. However, in the light emitting device, joining the substrate and the light emitting element may be unstable since the phosphor-containing resin covering the light emitting element and the substrate are apart from each other.

On the other hand, in the light emitting device described in Japanese Laid-open Patent Publication No. 2007-220942, by surrounding the periphery of the phosphor part with the wall face part formed by the reflection frame, the light emitting element is firmly joined to the substrate. However, to manufacture the light emitting device described in the patent literature 2, the inside of the reflection frame is to be filled with a resin after the light emitting element is connected to the wiring pattern formed on the substrate by a wire and the reflection frame is fixed onto the substrate. Consequently, production efficiency decreases.

An object is to provide a light emitting device in which a light emitting element can be firmly joined to a substrate while preventing deterioration in production efficiency and a method of manufacturing the light emitting device.

A light emitting device according to an embodiment includes a light emitting element including electrodes on its under face, a phosphor cover attached to the light emitting element so as to cover a top face and a side face of the light emitting element, and a reflection frame including a side face holding periphery of the phosphor cover and a tilted face tilting from the side face to the outside and upward.

Preferably, the side face of the reflection frame holds only the phosphor cover in a part lower than a predetermined position which is below the top face of the light emitting element.

Preferably, the predetermined position is determined to be a position of ⅓ to ⅔ of a height of the light emitting element.

Preferably, the light emitting device further includes a substrate to which the light emitting element, the phosphor cover, and the reflection frame are fixed and which is electrically connected to the electrodes.

Preferably, the light emitting device further includes a resin layer having a function of condensing or diffusing light emitted from the light emitting element and output from the phosphor cover and light which is wavelength-converted by the phosphor cover.

Preferably, a part of the reflection frame is disposed below an under face of the light emitting element.

Preferably, the reflection frame is formed by a resin member or a metal member including a surface on which a plating film is formed.

Preferably, the light emitting device further includes a second light emitting element including electrodes on its under face, and a second phosphor cover attached to the second light emitting element so as to cover a top face and a side face of the second light emitting element, wherein the reflection frame includes a second side face holding periphery of the second phosphor cover and a second tilted face tilting from the second side face to the outside and upward.

Preferably, the phosphor cover includes a first phosphor and a third phosphor different from the first phosphor, the second phosphor cover includes a second phosphor different from a first phosphor and a third phosphor different from the second phosphor, and peak wavelength of light which is wavelength-converted by the first phosphor is equal to or less than peak wavelength of light which is wavelength-converted by the second phosphor and is equal to or less than peak wavelength of light which is wavelength-converted by the fourth phosphor, and peak wavelength of light which is wavelength-converted by the third phosphor is equal to or less than the peak wavelength of light which is wavelength-converted by the second phosphor and is equal to or less than peak wavelength of light which is wavelength-converted by the fourth phosphor.

A method of manufacturing a light emitting device according to an embodiment includes attaching a phosphor cover to a light emitting element including electrodes on its under face so as to cover a top face and a side face of the light emitting element, forming, on a substrate, a reflection frame including a side face holding periphery of the phosphor cover and a tilted face tilting from the side face to the outside and upward, and mounting the light emitting element on the substrate so that the periphery of the phosphor cover is held by the reflection frame.

Since the light emitting device is formed by making the phosphor cover attach to the light emitting element and joined to the reflection frame, the light emitting element can be firmly joined to the substrate while preventing deterioration in production efficiency.

Other features and advantages of the present light emitting device will be apparent from the ensuing description, taken in conjunction with the accompanying drawings, in which:

DESCRIPTION OF EMBODIMENTS

Hereinafter, light emitting devices according to an embodiment, will be described with reference to the drawings. However, it should be noted that the technical scope of the invention is not limited to these embodiments, and extends to the inventions described in the claims and their equivalents.

Figure 1A:
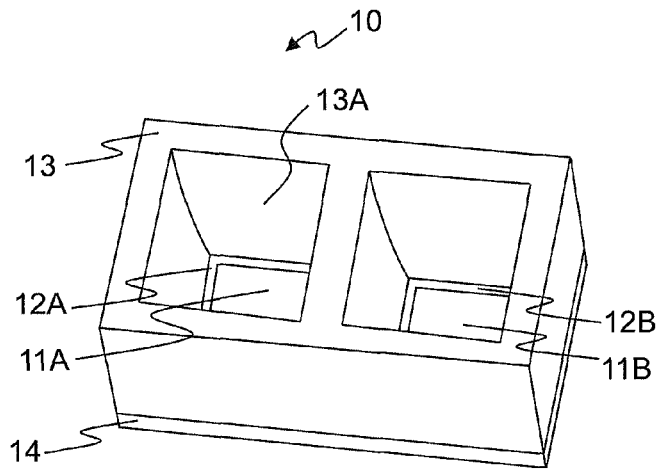
FIG. 1A is a schematic perspective view of a light emitting device 10.
Figure 1B:
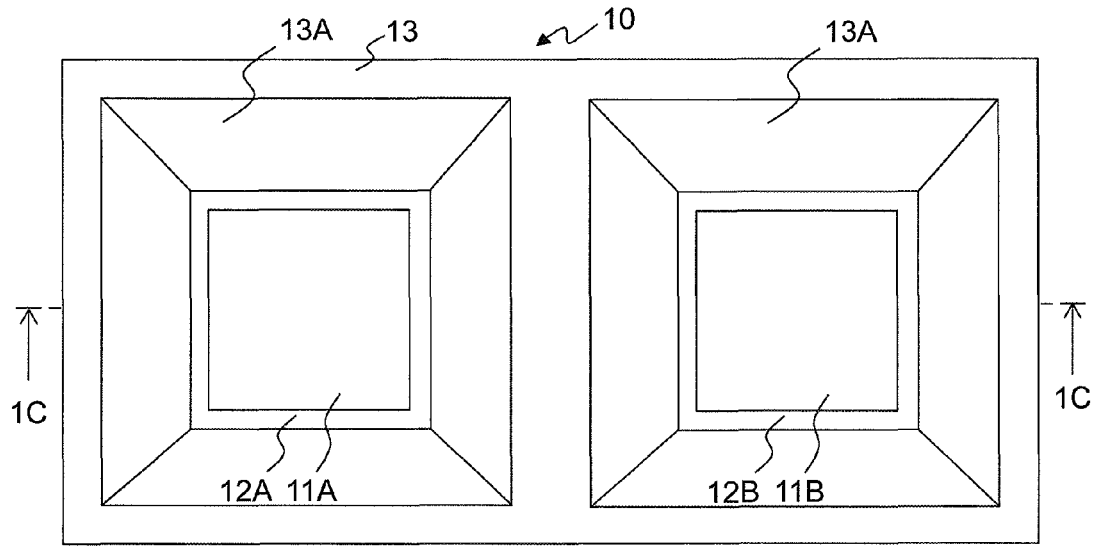
FIG. 1B is a schematic top view of a light emitting device 10.
Figure 1C:
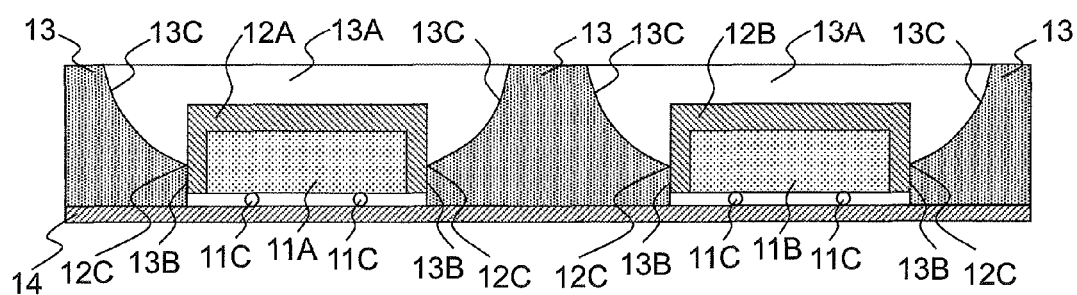
FIG. 1C is a schematic cross section of a light emitting device 10.

FIG. 1A is a schematic perspective view of a light emitting device 10. FIG. 1B is a schematic top view of the light emitting device 10. FIG. 1C is a cross section taken along line 1C-1C in FIG. 1B.

The light emitting device 10 includes LED elements 11A and 11B, phosphor covers 12A and 12B, a reflection frame 13, and a substrate 14.

The LED elements 11A and 11B are semiconductor blue-light-emitting elements (blue elements). For the LED elements 11A and 11B, for example, an InGaN compound semiconductor having a light emission wavelength range is 440 to 455 nm is used. For the LED elements 11A and 11B, preferably, LEDs whose forward voltage (VF), temperature characteristics, life, and the like are regarded almost equal to each other are used. Consequently, it is preferable to use LEDs using, as materials, compound semiconductors of the same series as the LED elements 11A and 11B. Each of the LED elements 11A and 11B is formed in a rectangular parallelepiped shape and has, on its bottom face, electrodes (bumps) 11C for flip chip mounting on the substrate 14. The shape of the LED elements 11A and 11B is not limited to a rectangular parallelepiped shape but may be another shape such as a cylinder or octagon.

The phosphor cover 12A includes a colorless transparent resin such as epoxy resin or silicon resin and is attached to the LED element 11A so as to cover the top face and side faces of the LED element 11A. The phosphor cover 12A has a tubular shape and its inner faces are in contact with the top face and side faces of the LED element 11A. In the phosphor cover 12A, first and second phosphors are dispersedly mixed. Similarly, the phosphor cover 12B includes a colorless transparent resin such as epoxy resin or silicon resin and is attached to the LED element 11B so as to cover the top face and side faces of the LED element 11B. The phosphor cover 12B has a tubular shape and its inner faces are in contact with the top face and side faces of the LED element 11B. In the phosphor cover 12B, third and fourth phosphors are dispersedly mixed.

The first phosphor is a particulate phosphor material that absorbs blue light emitted from the LED element 11A and wavelength-converts the light to cyan light. The range of the peak wavelength of the light which is wavelength-converted by the first phosphor is 480 to 500 nm. As the first phosphor, for example, a silicate phosphor which is activated by $Eu^{2+}$ (europium), a phosphor of barium silicon oxynitride, or the like is used.

The second phosphor is different from the first phosphor and is a particulate phosphor material that absorbs blue light emitted from the LED element 11A and wavelength-converts the light to yellow light. The range of the peak wavelength of the light which is wavelength-converted by the second phosphor is 535 to 570 nm. As the second phosphor, for example, a YAG (yttrium aluminum garnet) phosphor which is activated by cerium or the like is used.

The third phosphor is different from the first phosphor and the second phosphor and is a particulate phosphor material that absorbs blue light emitted from the LED element 11B and wavelength-converts the light to yellow light. The range of the peak wavelength of the light which is wavelength-converted by the third phosphor is 535 to 570 nm. As the third phosphor, for example, a YAG (yttrium aluminum garnet) phosphor which is activated by cerium or the like is used. The third phosphor may be the same phosphor as the second phosphor.

The fourth phosphor is different from the first phosphor, the second phosphor and the third phosphor and is a particulate phosphor material that absorbs blue light emitted from the LED element 11B and wavelength-converts the light to red light. The range of the peak wavelength of the light which is wavelength-converted by the fourth phosphor is 600 to 630 nm. As the fourth phosphor, for example, a $CaAlSiN_3$ (calcium aluminum silicon oxynitride) phosphor in which $Eu^{2+}$ (europium) is dissolved, or the like is used.

The peak wavelength of the cyan light which is wavelength-converted by the first phosphor is set to be equal to or less than the peak wavelength of the yellow light which is wavelength-converted by the second phosphor. The peak wavelength of the yellow light which is wavelength-converted by the second phosphor is set to be equal to or less than the peak wavelength of the yellow light which is wavelength-converted by the third phosphor. The peak wavelength of the yellow light which is wavelength-converted by the third phosphor is set to be equal to or less than the peak wavelength of the red light which is wavelength-converted by the fourth phosphor.

The light emitting device 10 mixes the light emitted from the LED element 11A and output from the phosphor cover 12A, the light which is wavelength-converted by the phosphor cover 12A, the light emitted from the LED element 11B and output from the phosphor cover 12B, and the light which is wavelength-converted by the phosphor cover 12B to obtain white light.

The reflection frame 13 is a frame member having an almost rectangular shape and includes openings 13A corresponding to the LED element 11A and the phosphor cover 12A, and the LED element 11B and the phosphor cover 12B. The reflection frame 13 is formed by a white resin member, and a plating film is formed on the surface of the resin member. The plating is not limited and may be wet plating such as electro plating or chemical plating or dry plating such as vacuum deposition, chemical vapor deposition (CVD), or sputtering. By forming the plating film on the reflection frame 13, heat generated from the LED elements 11A and 11B is conducted to the plating film, and the plating film also functions as heat capacitor. Consequently, the radiation performance of the LED elements 11A and 11B can be improved. Therefore, in the case of using the light emitting device 10 as a light for taking a photograph by a cell phone or the like, light amount can be rapidly reduced.

The reflection frame 13 may be formed by a metal member. In this case, the heat capacity which absorbs heat generated from the LED elements 11A and 11B is larger and, moreover, the heat generated from the LED elements 11A and 11B is conducted from the entire reflection frame 13 to the substrate (not illustrated) on which the light emitting device 10 is mounted, so that the radiation performance of the LED elements 11A and 11B can be further improved. Therefore, in the case of using the light emitting device 10 as a light which is lighted on for long time, accumulation of heat in the light emitting device 10 can be suppressed.

The reflection frame 13 includes side faces 13B formed so as to be orthogonal to the top faces of the LED elements 11A and 11B and holding the periphery of the phosphor covers 12A and 12B and tilted faces 13C which tilt from the side faces 13B to the outside and upward, that is, to the outside from the phosphor covers 12A and 12B and upward.

The side face 13B is formed so as to be lower than the side face of the LED element 11A and holds only the phosphor cover 12A in the part lower than a predetermined position 12C below the top face of the LED element 11A, in the part of the side face of the LED element 11A covered by the phosphor cover 12A. Similarly, the side face 13B is formed so as to be lower than the side face of the LED element 11B and holds only the phosphor cover 12B in the part lower than a predetermined position 12C below the top face of the LED element 11B, in the part of the side face of the LED element 11B covered by the phosphor cover 12B.

The light emitted from the LED elements 11A and 11B toward the side faces 13B and light emitted from the phosphor covers 12A and 12B toward the side faces 13B are reflected by the side faces 13B toward the phosphor covers 12A and 12B and the LED elements 11A and 11B. Therefore, those lights can be also used as outgoing light of the light emitting device 10, and light use efficiency of the light emitting device 10 can be improved.

However, there is the possibility that the light reflected by the side faces 13B may be absorbed by the phosphors contained in the phosphor covers 12A and 12B, the light emission faces of the LED elements 11A and 11B, and the like and attenuated. There is also the possibility that a part of the light which is not wavelength-converted at the time of passing through the phosphor covers 12A and 12B for the first time, is reflected by the side face 13B and, when the light passes through the phosphor covers 12A and 12B again, is wavelength-converted, and the side face 13B exerts influence on the color of the light emitted from the light emitting device 10. To reduce the attenuation of the light and the influence on the color of the light, preferably, the area of the side faces 13B which are in contact with the phosphor covers 12A and 12B is reduced to make as much light as possible go toward the tilted faces 13C. Preferably, the predetermined position 12C is determined to be a position which is equal to or lower than $2/3$ of the height of the LED elements 11A and 11B.

On the other hand, since the LED elements 11A and 11B and the phosphor covers 12A and 12B are held by the side faces 13B, the LED elements 11A and 11B and the phosphor covers 12A and 12B can be firmly joined to the substrate 14. To firmly join the LED elements 11A and 11B and the phosphor covers 12A and 12B to the substrate 14, preferably, the predetermined position 12C is determined to be a position at $1/3$ of the height or higher of the LED elements 11A and 11B.

Therefore, it is preferable that the predetermined position 12C is determined to be between $1/3$ and $2/3$ of the height of the LED elements 11A and 11B.

The tilted faces 13C reflect the light emitted from the LED elements 11A and 11B toward the tilted faces 13C and the light outgoing from the phosphor covers 12A and 12B toward the tilted faces 13C to the upper side of the light emitting device 10 (to the side of the openings 13A seen from the LED elements 11A and 11B). Therefore, the intensity of the light emitted from the light emitting device 10 can be improved. Each tilted face 13C has a parabola (paraboloid of revolution) shape. Note that the tilted face 13C may have a mortar shape (a shape like a side face of a truncated cone).

The substrate 14 is, for example, an insulating substrate such as a glass epoxy substrate, a BT resin substrate, a ceramic substrate, or a metal core substrate having a surface on which the LED elements 11A and 11B, the phosphor covers 12A and 12B, and the reflection frame 13 are fixed. On the substrate 14, electrodes (not illustrated) for bonding with the LED elements 11A and 11B and a circuit pattern (not illustrated) are formed. The electrodes 11C of the LED elements 11A and 11B are flip-chip bonded on the substrate 14, and the substrate 14 is electrically connected to the electrodes 11C of the LED elements 11A and 11B. The electrodes of the LED elements 11A and 11B may be connected to the electrodes for bonding on the substrate 11 via a conductive adhesive material such as Ag paste or the like. Further, the electrodes for bonding on the substrate 14 are electrically connected to electrodes (not illustrated) for connection to a DC (Direct Current) power supply on the outside.

The light emitting device 10 is provided as a packaged module. The light emitting device 10 is used by being mounted on a substrate of a device using the light emitting device 10 (that is, a substrate different from the substrate 14). By providing the light emitting device 10 as a packaged module in such a manner, the flexibility of designing of a device using the light emitting device 10 can be improved, and a development period and a development cost can be reduced.

Each of the number of LED elements and the number of phosphor covers of the light emitting device 10 is not limited to two but may be one or three or more.

In the case where each of the number of the LED elements and the number of the phosphor covers is one, in the light emitting device 10, the LED element 11B, the phosphor cover 12B, and a part surrounding the LED element 11B and the phosphor cover 12B in the reflection frame 13 (the part of the right half of the light emitting device 10 illustrated in FIGS. 1A to 1C) are omitted.

In this case, in the phosphor cover 12A, a particulate phosphor material which absorbs blue light emitted from the LED element 11 and wavelength-converts the light to yellow light is dispersedly mixed. The range of the peak wavelength of the light which is wavelength-converted by the phosphor material dispersedly mixed in the phosphor cover 12A is 535 to 570 nm. As the phosphor material, for example, a YAG (yttrium aluminum garnet) phosphor which is activated by cerium or the like is used. The light emitting device 10 mixes the light emitted from the blue LED 11A and emitted from the phosphor cover 12A and light which is wavelength-converted by the phosphor cover 12A to obtain white light.

In the case where each of the number of LED elements and the number of phosphor covers is three, in the light emitting device 10, an LED element and a phosphor cover are added on the side opposite to the LED element 11A and the phosphor cover 12A of the LED element 11B and the phosphor cover 12B (the right side of the light emitting device 10 illustrated in FIGS. 1A to 1C). The reflection frame 13 is formed so as to surround the LED element and the phosphor cover which are added.

In this case, the first phosphor is dispersedly mixed in the phosphor cover 12A, the second phosphor is dispersedly mixed in the phosphor cover 12B, and the third and fourth phosphors are mixed in the added phosphor cover. In this case as well, the light emitting device 10 mixes the light emitted from the LED elements and output from the phosphor covers and the light wavelength-converted by the phosphor covers to obtain white light.

FIGS. 2A to 2D are schematic diagrams for explaining manufacturing process of the light emitting device 10.

Figure 2A:
FIG. 2A is a schematic diagram for explaining manufacturing process of the light emitting device 10.
Figure 2B:
FIG. 2B is a schematic diagram for explaining manufacturing process of the light emitting device 10.
Figure 2C:
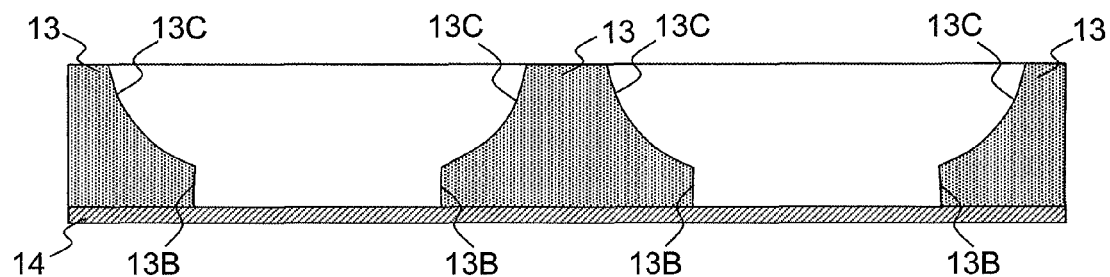
FIG. 2C is a schematic diagram for explaining manufacturing process of the light emitting device 10.
Figure 2D:
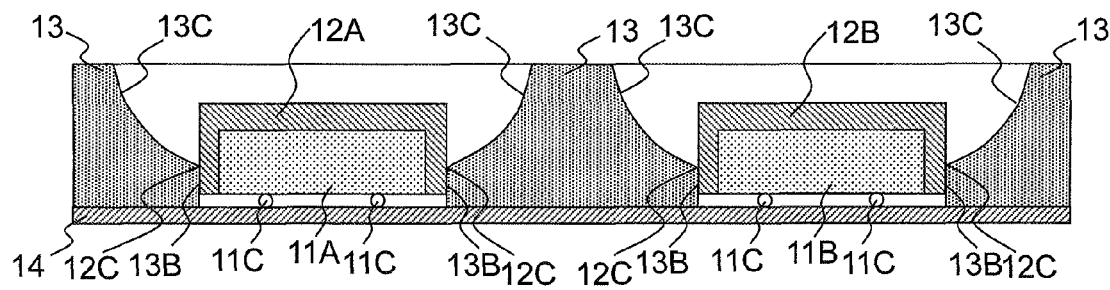
FIG. 2D is a schematic diagram for explaining manufacturing process of the light emitting device 10.

First, as illustrated in FIG. 2A, the LED elements 11A and 11B each including, on its under face, the electrodes 11C are formed. Next, as illustrated in FIG. 2B, the phosphor covers 12A and 12B are attached to the LED elements 11A and 11B, respectively, so that the top face and side faces of each of the LED elements 11A and 11B are covered. Subsequently, as illustrated in FIG. 2C, the reflection frame 13 having the side faces 13B holding the periphery of the phosphor covers 12A and 12B and the tilted faces 13C tilted from the side faces 13B to the outside and upward is formed on the substrate 14 and fixed. The order of process illustrated in FIGS. 2A and 2B and the process illustrated in FIG. 2C may be reversed. Subsequently, as illustrated in FIG. 2D, the LED elements 11A and 11B are mounted on the substrate 14 so that the peripheries of the phosphor covers 12A and 12B are held by the reflection frame 13. The electrodes 11C of the LED elements 11A and 11B are flip-chip bonded on the substrate 14. The reflection frames 13 and the phosphor covers 12A and 12B are adhered by an adhesive or the like. After that, the process of manufacturing the light emitting device 10 is finished.

Since the LED elements 11A and 11B are flip-chip bonded on the substrate 14, different from the case where they are mounted by wire bonding, the LED elements 11A and 11B can be easily mounted even after the reflection frame 13 is fixed on the substrate 14. By attaching the phosphor covers 12A and 12B to the LED elements 11A and 11B, the peripheries of the LED elements 11A and 11B can be covered with the phosphor material more easily than the case of burying a rein containing phosphor in the reflection frame 13. Therefore, the light emitting device 10 can be easily manufactured, and production efficiency of the light emitting device 10 can be improved.

Figure 3A:
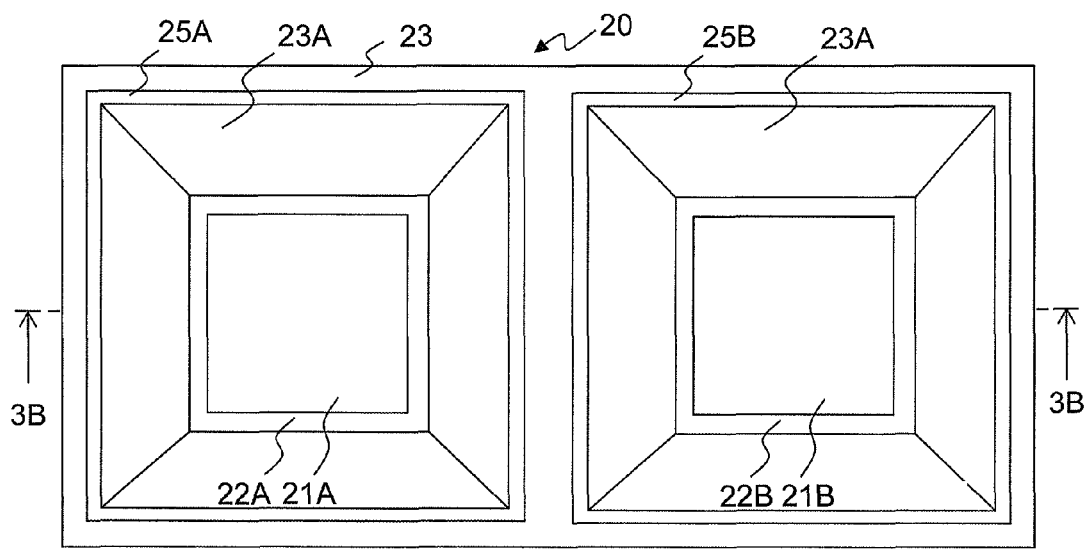
FIG. 3A is a schematic top view of a light emitting device 20.
Figure 3B:
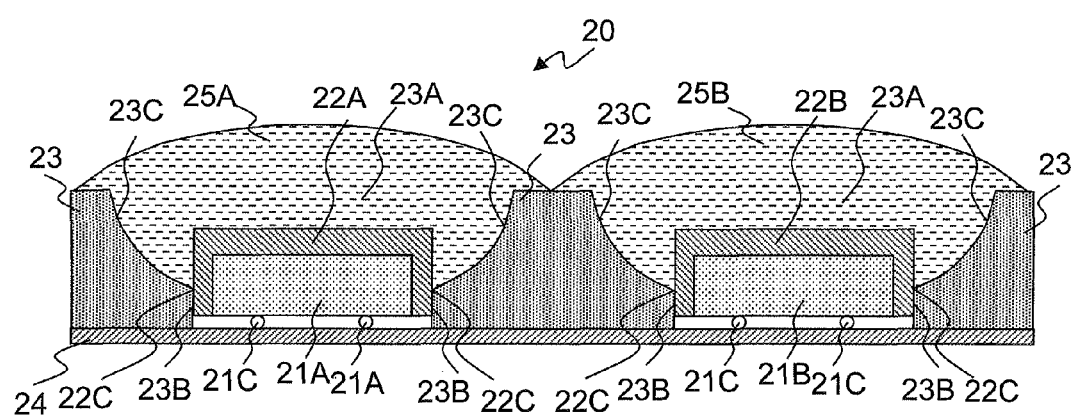
FIG. 3B is a schematic cross section of a light emitting device 20.

FIG. 3A is a schematic top view of a light emitting device 20. FIG. 3B is a cross section taken along line 3B-3B of FIG. 3A. The light emitting device 20 includes, in addition to the components of the light emitting device 10, resin layers 25A and 25B.

The resin layer 25A is formed in a reflection frame 23 so as to have a curved surface of a convex lens shape and has the function of condensing the light emitted from an LED element 21A and output from a phosphor cover 22A and the light which is wavelength-converted by the phosphor cover 22A into a predetermined direction. Similarly, the resin layer 25B is formed in the reflection frame 23 so as to have a curved surface of a convex lens shape and has the function of condensing the light emitted from an LED element 21B and output from a phosphor cover 22B and the light which is wavelength-converted by the phosphor cover 22B into a predetermined direction. By the resin layers 25A and 25B, light condensing performance of the light emitted from the light emitting device 10 can be improved.

The resin layer 25A may be formed in the reflection frame 23 so as to have a curved surface of a concave lens shape and have the function of diffusing the light emitted from the LED element 21A and output from the phosphor cover 22A and the light which is wavelength-converted by the phosphor cover 22A. Similarly, the resin layer 25B may be formed in the reflection frame 23 so as to have a curved surface of a concave lens shape and have the function of diffusing the light emitted from the LED element 21B and output from the phosphor cover 22B and the light which is wavelength-converted by the phosphor cover 22B. With the configuration, diffusion performance of the light emitted from the light emitting device 10 can be improved.

Except for the above, the configuration of the light emitting device 20 is the same as that of the light emitting device 10.

FIGS. 4A to 4E are schematic views for explaining manufacturing process of the light emitting device 20.

Figure 4A:
FIG. 4A is a schematic view for explaining manufacturing process of the light emitting device 20.
Figure 4B:
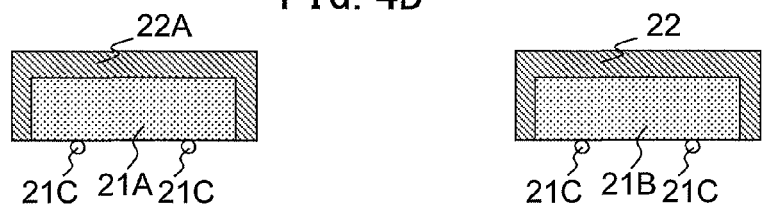
FIG. 4B is a schematic view for explaining manufacturing process of the light emitting device 20.
Figure 4C:
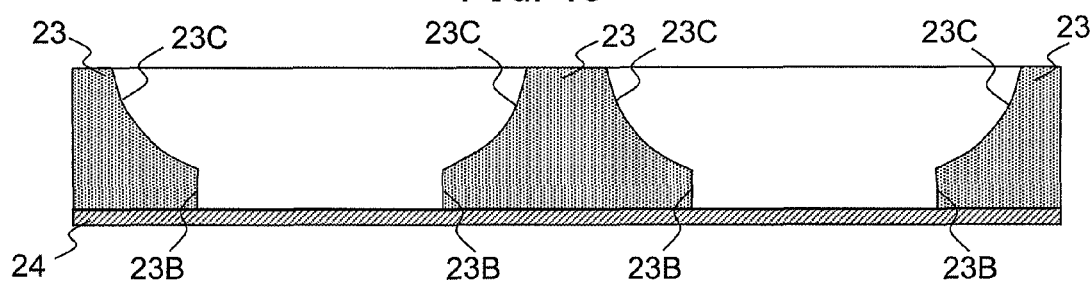
FIG. 4C is a schematic view for explaining manufacturing process of the light emitting device 20.
Figure 4D:
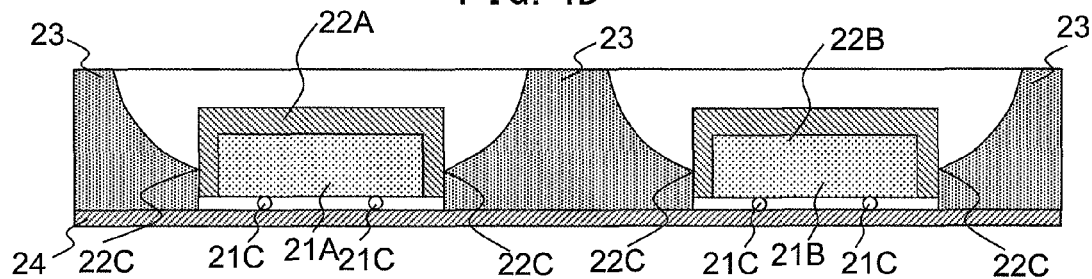
FIG. 4D is a schematic view for explaining manufacturing process of the light emitting device 20.
Figure 4E:
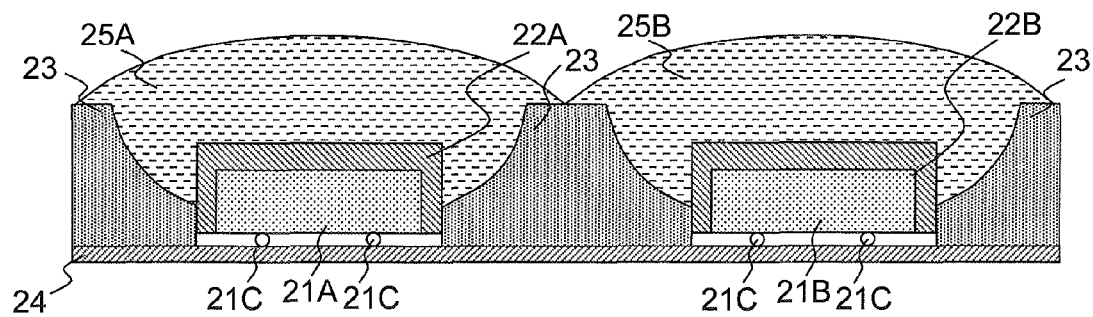
FIG. 4E is a schematic view for explaining manufacturing process of the light emitting device 20.

Since the process illustrated in FIGS. 4A to 4D is similar to that illustrated in FIGS. 2A to 2D, its detailed description will not be repeated. As illustrated in FIG. 4E, after the LED elements 21A and 21B and the phosphor covers 22A and 22B are joined in the reflection frame 23, the resin layers 25A and 25B are formed in the reflection frame 23. The resin layers 25A and 25B are formed by, for example, injecting transparent thermosetting resin such as epoxy resin into the reflection frame 23 and thermosetting the resin. Alternatively, the resin layers 25A and 25B may be formed by, for example, ultraviolet curable resin. After that, the process of manufacturing the light emitting device 20 is finished.

Figure 5A:
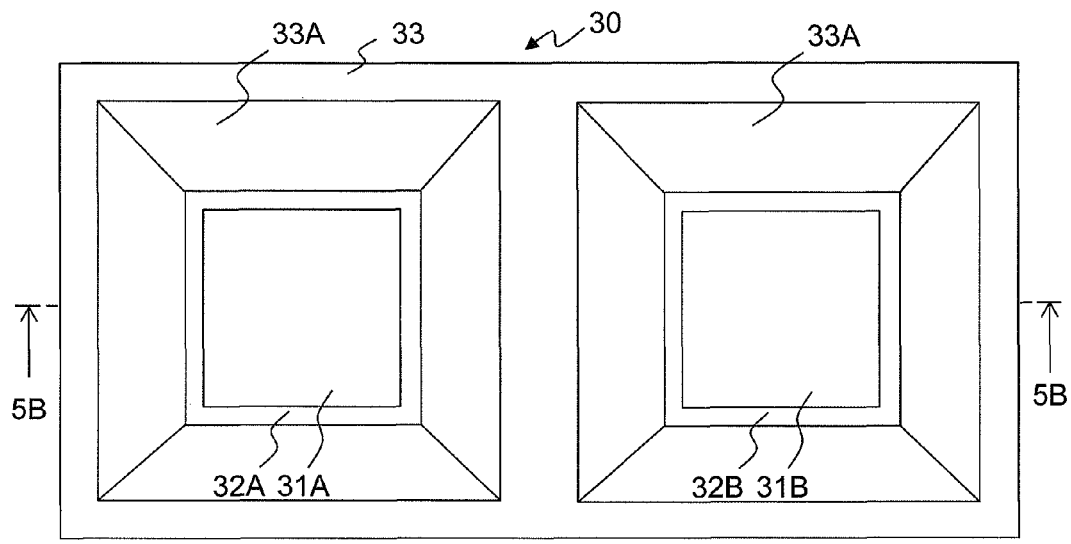
FIG. 5A is a schematic top view of a light emitting device 30.
Figure 5B:
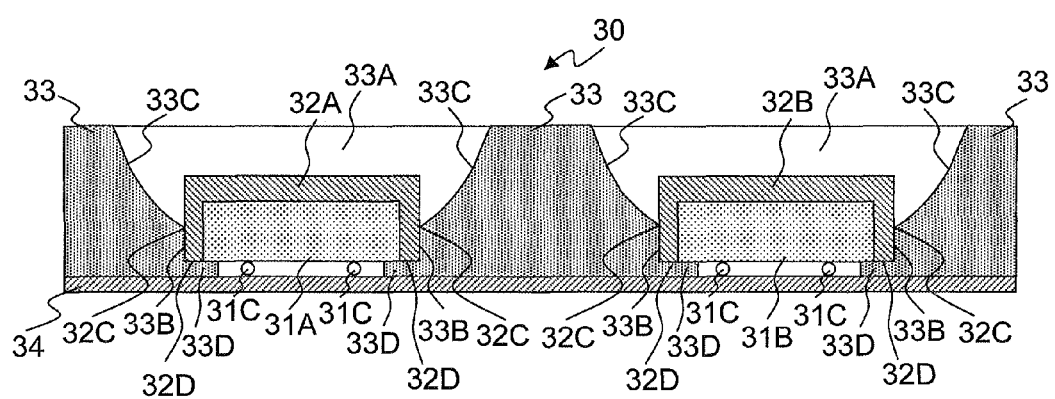
FIG. 5B is a schematic cross section of a light emitting device 30.

FIG. 5A is a schematic top view of a light emitting device 30. FIG. 5B is a cross section taken along line 5B-5B in FIG. 5A. The light emitting device 30 includes a reflection frame 33 in place of the reflection frame 13 of the light emitting device 10.

The reflection frame 33 is a member similar to the reflection frame 13. The reflection frame 33 includes, however, projections 33D which are joined to the under faces of LED elements 31A and 31B, and a part of the reflection frame 33 is disposed below the under face of the LED elements 31A and 31B. By partially disposing the reflection frame 33 below the under faces of the LED elements 31A and 31B, faces 32D horizontal to the under faces of the LED elements 31A and 31B in phosphor covers 32A and 32B are covered. Therefore, light emitted from the LED elements 31A and 31B and output from the faces 32D is reflected by the reflection frame 33 and goes toward the outgoing direction of the light emitting device 30, so that the light emission intensity of the light emitting device 30 can be further improved.

Except for the above point, the configuration of the light emitting device 30 is the same as that of the light emitting device 10. The light emitting device 30 may further include a resin layer like the light emitting device 20.

Since the manufacturing process of the light emitting device 30 is similar to that of the light emitting device 10 except for the point that a part of the reflection frame 33 is disposed below the under faces of the LED elements 31A and 31B, the detailed description will not be repeated.

Figure 6A:
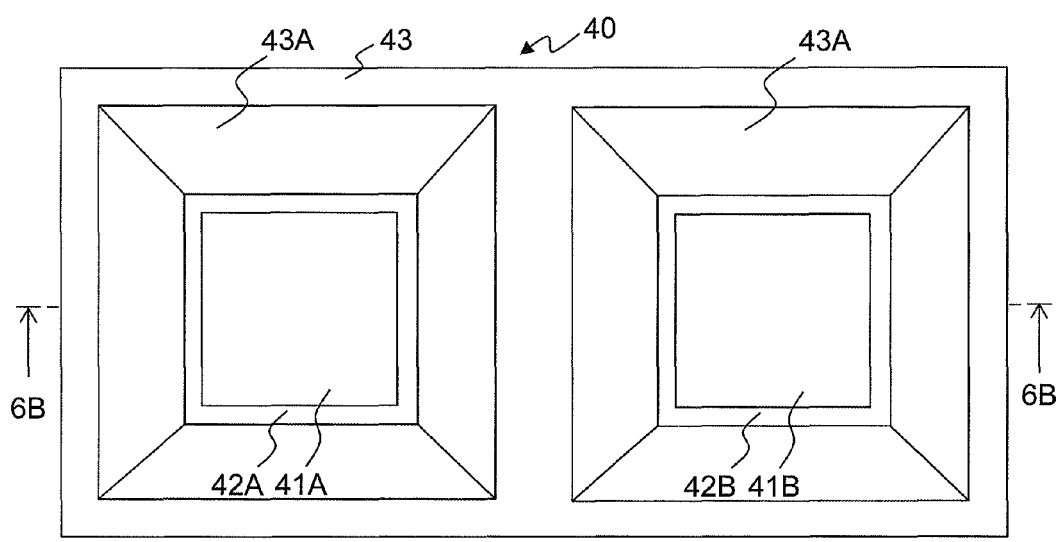
FIG. 6A is a schematic top view of a light emitting device 40.
Figure 6B:
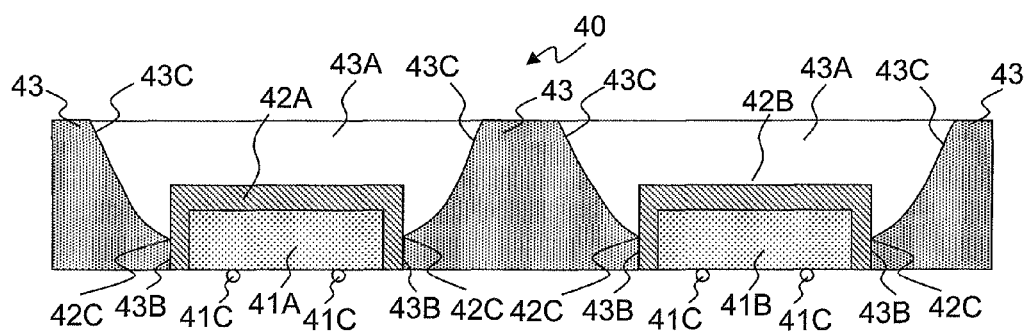
FIG. 6B is a schematic cross section of a light emitting device 40.

FIG. 6A is a schematic top view of a light emitting device 40. FIG. 6B is a cross section taken along line 6B-6B in FIG. 6A. In the light emitting device 40, the substrate 14 is omitted in the components of the light emitting device 10. FIG. 6B illustrates an example that the under faces of LED elements 41A and 41B are disposed horizontal to the under face of a reflection frame 43. Alternatively, the under face of electrodes 41C of the LED elements 41A and 41B may be disposed horizontal to the under face of the reflection frame 43.

Except for the above point, the configuration of the light emitting device 40 is the same as that of the light emitting device 10. The light emitting device 40 may further include a resin layer like the light emitting device 20. In the light emitting device 40, like the light emitting device 30, a part of the reflection frame 43 may be disposed below the under face of the LED elements 41A and 41B. In this case, occurrence of light leakage from the under face of the light emitting device 40 can be suppressed.

The light emitting device 40 is also provided as a packaged module like the light emitting device 10. The light emitting device 40 is used by being mounted on a substrate of a device using the light emitting device 40 and electrically connecting the electrodes 41C to the substrate.

Since the manufacturing process of the light emitting device 40 is similar to that of the light emitting device 10 except for the point that the reflection frame 43 is not fixed to the substrate, the detailed description will not be repeated.

As described above, each of the light emitting devices 10 to 40 is formed by making the phosphor cover attach to the light emitting element and further joining it to the reflection frame. Consequently, the light emitting element can be firmly joined to the substrate while preventing deterioration in production efficiency.

Each of the light emitting devices 10 to 40 can be used, for example, as a light source such as a back light in a liquid crystal display of a large area. Each of the light emitting devices 10 to 40 can be used as various illuminating light sources such as a light guide plate lighting in a liquid crystal display of a small area of a cellular phone and a back light unit of meters or indicators.

FIGS. 7A to 7E and FIG. 8 are graphs schematically illustrating spectra of lights emitted from LEDs and the phosphor. The horizontal axis of each of FIGS. 7A to 7E and FIG. 8 indicates wavelength which becomes longer to the right. The vertical axis of each of FIGS. 7A to 7E and FIG. 8 indicates intensity of light which becomes higher to the upside.

Figure 7A:
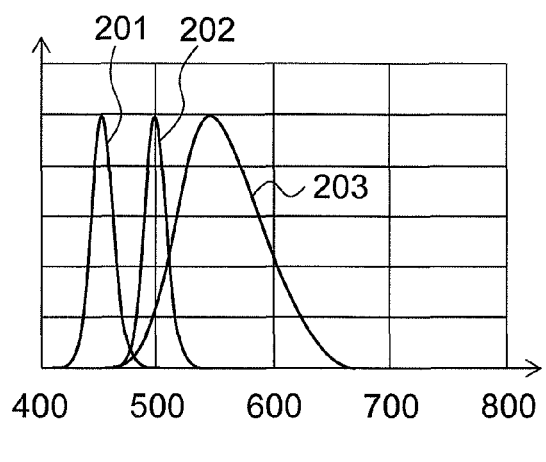
FIG. 7A is a graph schematically illustrating spectra of lights emitted from LEDs and phosphors.

Graph 201 in FIG. 7A indicates spectrum of blue light emitted from the LED element 11A according to an example, graph 202 indicates spectrum of cyan light which is wavelength-converted by the first phosphor according to an example, and graph 203 indicates spectrum of yellow light which is wavelength-converted by the second phosphor according to an example. In FIG. 7A, spectra of lights normalized are displayed.

Figure 7B:
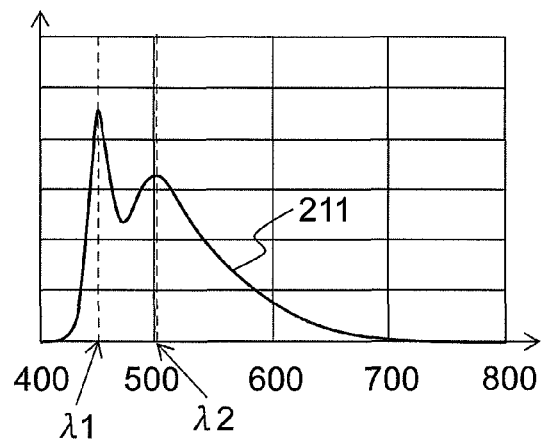
FIG. 7B is a graph schematically illustrating spectra of lights emitted from LEDs and phosphors.

Graph 211 in FIG. 7B indicates spectrum of light emitted from the phosphor cover 12A. In the spectrum illustrated in FIG. 7B, respective peaks of intensities exist around peak wavelength $\lambda 1$ of the blue light and peak wavelength $\lambda 2$ of the cyan light. In the phosphor cover 12A, the amount of the first phosphor and the second phosphor contained in the phosphor cover 12A is adjusted so that the intensity of the blue light is not too low. Consequently, the intensity in the peak wavelength $\lambda 2$ of the cyan light is lower than the peak in the peak wavelength $\lambda 1$ of the blue light and, in a region where the wavelength is longer than the peak wavelength $\lambda 2$, the wave shape base becomes broader and the intensity gently decreases as the wavelength becomes longer.

Figure 7C:
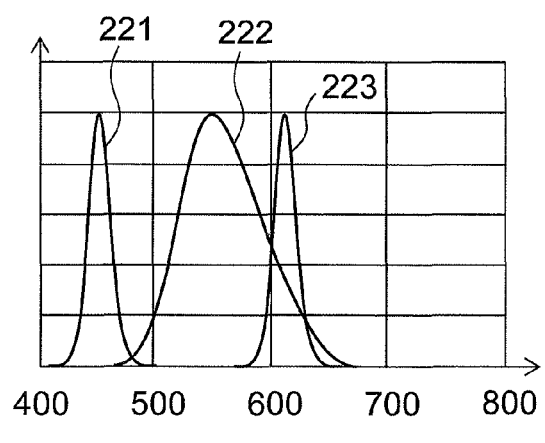
FIG. 7C is a graph schematically illustrating spectra of lights emitted from LEDs and phosphors.

Graph 221 in FIG. 7C indicates spectrum of blue light emitted from the LED element 11B according to an example, graph 222 indicates spectrum of yellow light which is wavelength-converted by the third phosphor according to an example, and graph 223 indicates spectrum of red light which is wavelength-converted by the fourth phosphor according to an example. In FIG. 7C, spectra of lights normalized are displayed.

Figure 7D:
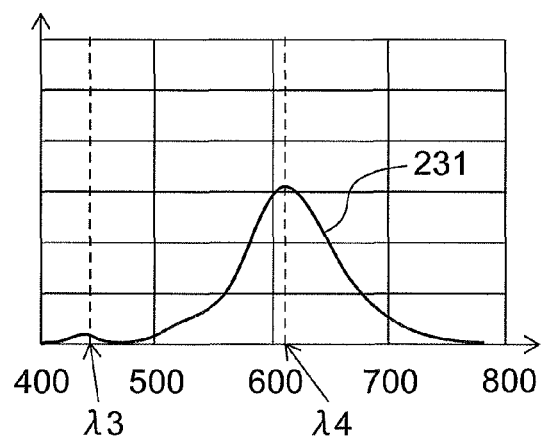
FIG. 7D is a graph schematically illustrating spectra of lights emitted from LEDs and phosphors.

Graph 231 in FIG. 7D indicates spectrum of light emitted from the phosphor cover 12B. In the spectrum illustrated in FIG. 7D, respective peaks of intensities exist around peak wavelength λ3 of the blue light and peak wavelength λ4 of the red light. In the phosphor cover 12B, blue light emitted from the LED element 11B is absorbed by the third phosphor and the fourth phosphor, and the yellow light which is wavelength-converted by the third phosphor is absorbed by the fourth phosphor. Consequently, the intensity of the blue light and the yellow light is low. However, the wave shape base whose peak is wavelength λ4 becomes broader and the intensity gently decreases.

Figure 7E:
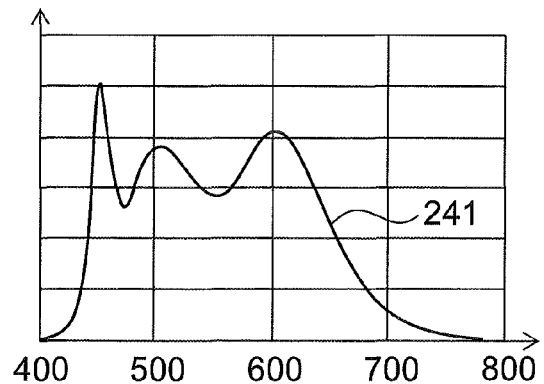
FIG. 7E is a graph schematically illustrating spectra of lights emitted from LEDs and phosphors.

Graph 241 in FIG. 7E indicates spectrum of the entire light output from the light emitting device 10. Since the reflection frame 13 is provided between the phosphor covers 12A and 12B in the light emitting device 10, the light emitted from the phosphor cover 12A is not absorbed by the third phosphor and the fourth phosphor. Therefore, as illustrated in FIG. 7E, the spectrum of the light emitted from the light emitting device 10 almost matches a spectrum obtained by adding the intensities illustrated in graph 231 in FIG. 7D to the intensities illustrated in graph 211 in FIG. 7B at the respective wavelengths.

In the spectrum illustrated in FIG. 7E, a wavelength of low intensity does not exist, and the intensity is high in the entire wavelength. Therefore, the light emission spectrum of the entire light emitting device 10 is close to the spectrum of solar light, and white light emitted from the light emitting device 10 is white light of more natural tint (i.e., higher color rendering index).

Figure 8:
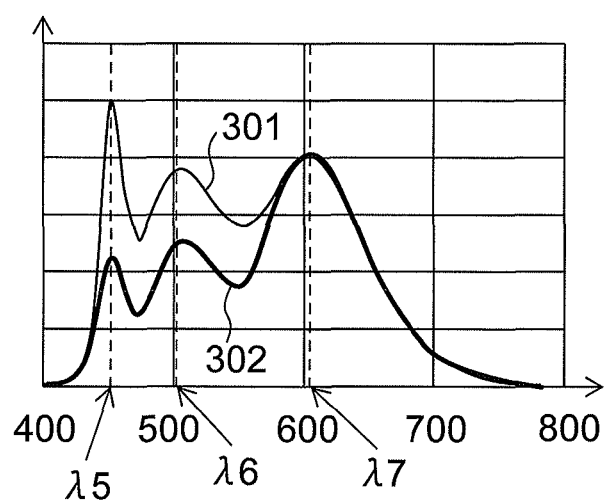
FIG. 8 is a graph schematically illustrating spectra of lights emitted by the light emitting device 10 and a phosphor sheet for comparison.

Graph 301 in FIG. 8 indicates spectrum of light emitted from the light emitting device 10 and graph 302 indicates spectrum of light emitted in the case of eliminating the reflection frame 13 in the light emitting device 10. In the case of eliminating the reflection frame 13, the blue light emitted from the LED element 11A and the cyan light which is wavelength-converted by the first phosphor are absorbed by the third phosphor and the fourth phosphor, respectively. The yellow light which is wavelength-converted by the first phosphor is absorbed by the fourth phosphor. Therefore, in the spectrum illustrated by graph 302, the intensity of light having short wavelength (particularly, around peak wavelength 25 of the blue light and peak wavelength λ6 of the cyan light) is low as compared with the spectrum illustrated by graph 301. Consequently, in the case of eliminating the reflection frame 13, total luminous flux of light emitted from the light emitting device 10 is low.

Since the reflection frame 13 reflects light emitted from the side faces of the LEDs and the phosphors in the light-outgoing direction of the light emitting device 10, total luminous flux of the light emitted from the light emitting device 10 is high. By the reflection frame 13, the directivity of the light can be narrowed. In the case of further adding optical parts such as a lens and a reflection frame to the light emitting device 10, efficiency of light incidence to the optical parts can be increased, and optical design for the optical parts can be facilitated.

Figure 9:
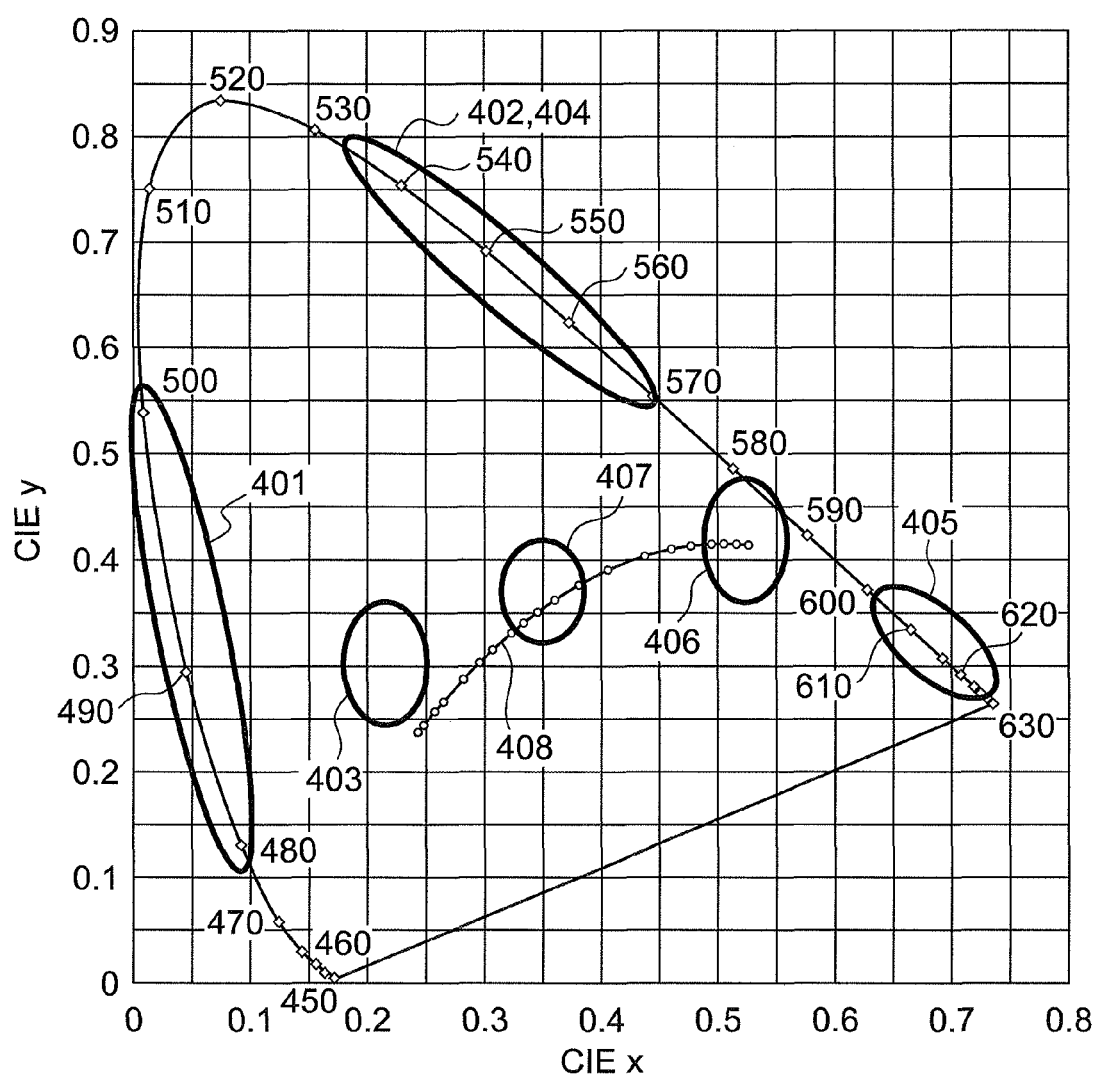
FIG. 9 is a CIExy chromaticity diagram of phosphors.

FIG. 9 is a CIE (Commission Internationale de l'Eclairage) xy chromaticity diagram of the first phosphor, the second phosphor, the third phosphor, and the fourth phosphor used in the light emitting device 10. The horizontal axis of FIG. 9 indicates CIEx, and the vertical axis indicates CIEy.

A region 401 is a region corresponding to the cyan light which is wavelength-converted by the first phosphor, a region 402 is a region corresponding to the yellow light which is wavelength-converted by the second phosphor, and a region 403 is a region corresponding to light emitted from the phosphor cover 12A. A region 404 is a region corresponding to the yellow light wavelength-converted by the third phosphor, a region 405 is a region corresponding to the red light wavelength-converted by the fourth phosphor, and a region 406 is a region corresponding to light emitted by the phosphor cover 12B.

A region 407 is a region corresponding to light emission color of the entire light emitting device 10. The region 407 is positioned near a black-body locus 408, thereby indicating that light emitted from the light emitting device 10 is white light having high color rendering index.

White light can be also obtained from a phosphor sheet obtained by combining the first phosphor and the fourth phosphor and a phosphor sheet obtained by combining the phosphors the second phosphor and the third phosphor. However, generally, a phosphor has characteristics of absorbing light having a shorter wavelength than the wavelength of light to be wavelength-converted and, the larger the difference between the wavelength of light to be absorbed and the wavelength of the light to be wavelength-converted is, absorbing larger amount of light. Consequently, when a phosphor sheet is manufactured by combining phosphors in which the wavelengths of light to be converted are largely different from each other such as the first phosphor and the fourth phosphor, much of light which is wavelength-converted by the first phosphor is absorbed by the fourth phosphor and is again wavelength-converted. Therefore, to obtain desired light, a large amount of the first phosphor is preferably included in a phosphor sheet in consideration of the fact that the light which is wavelength-converted by the first phosphor is absorbed by the fourth phosphor. When the amount of the phosphors contained in the phosphor sheet is large, light transmittance is low, and the intensity of light emitted is low.

When wavelengths of lights which are wavelength-converted by phosphors are largely different, there is also the possibility that manufacturing variations in the colors of lights emitted from respective phosphor covers become larger due to manufacture errors in the ratio of amounts of the phosphors included in the phosphor covers.

As described above, the peak wavelength of light which is wavelength-converted by the first phosphor is equal to or less than the peak wavelength of light which is wavelength-converted by the third phosphor and is equal to or less than the peak wavelength of light which is wavelength-converted by the fourth phosphor. The peak wavelength of light which is wavelength-converted by the second phosphor is also equal to or less than the peak wavelength of light which is wavelength-converted by the third phosphor and is equal to or less than the peak wavelength of light which is wavelength-converted by the fourth phosphor.

In other words, the phosphor sheets of the light emitting device 10 are configured by a combination of the first phosphor and the second phosphor and a combination of the third phosphor and the fourth phosphor, whose wavelengths of lights converted are close to each other. Therefore, in the light emitting device 10, the amount of the phosphors contained in each phosphor sheet can be made small and the intensity of outgoing light can be made high. Since the wavelengths of lights which are, wavelength-converted by the phosphors included in the phosphor sheet are close, variations occurring in the colors of lights emitted from the respective phosphor sheets can be suppressed even when an error occurs in the ratio of the amounts of the phosphors.

The preceding description has been presented only to illustrate and describe exemplary embodiments of the present invention. It is not intended to be exhaustive or to limit the invention to any precise form disclosed. It will be understood by those skilled in the art that various changes may be made and equivalents may be substituted for elements thereof without departing from the scope of the invention. In addition, many modifications may be made to adapt a particular situation or material to the teachings of the invention without departing from the essential scope. Therefore, it is intended that the invention not be limited to the particular embodiment disclosed as the best mode contemplated for carrying out this invention, but that the invention will include all embodiments falling within the scope of the claims. The invention may be practiced otherwise than is specifically explained and illustrated without departing from its spirit or scope.

What is claimed is:

1. A light emitting device comprising:
   a light emitting element including electrodes only on its under face, wherein the electrodes are flip-chip bonded to a substrate;
   a phosphor cover attached to the light emitting element so as to cover a top face and a side face of the light emitting element; and
   a reflection frame including a holding side face for contacting a periphery of the phosphor cover only at a position below the top face of the light emitting element to hold a periphery of the phosphor cover and a tilted face tilting from the holding side face position of contact to the outside and upward,
   wherein the tilted face is spaced from the periphery of the phosphor cover.

2. The light emitting device according to claim 1, wherein a height of the holding side face is ⅓ to ⅔ of a height of the light emitting element.

3. The light emitting device according to claim 1, wherein the light emitting element, the phosphor cover, and the reflection frame are fixed to the substrate, which is electrically connected to the electrodes.

4. The light emitting device according to claim 1, further comprising a resin layer having a function of condensing or diffusing light emitted from the light emitting element and output from the phosphor cover and light which is wavelength-converted by the phosphor cover.

5. The light emitting device according to claim 1, wherein a part of the reflection frame is disposed below an under face of the light emitting element.

6. The light emitting device according to claim 1, wherein the reflection frame is formed by a resin member or a metal member including a surface on which a plating film is formed.

7. The light emitting device according to claim 1, further comprising:
   a second light emitting element including electrodes on its under face; and
   a second phosphor cover attached to the second light emitting element so as to cover a top face and a side face of the second light emitting element;
   wherein the reflection frame includes a second side face holding periphery of the second phosphor cover and a second tilted face tilting from the second side face to the outside and upward.

8. The light emitting device according to claim 7, wherein
   the phosphor cover includes a first phosphor and a third phosphor different from the first phosphor,
   the second phosphor cover includes a second phosphor different from a first phosphor and a fourth phosphor different from the second phosphor, and
   peak wavelength of light which is wavelength-converted by the first phosphor is equal to or less than peak wavelength of light which is wavelength-converted by the second phosphor and is equal to or less than peak wavelength of light which is wavelength-converted by the fourth phosphor, and peak wavelength of light which is wavelength-converted by the third phosphor is equal to or less than the peak wavelength of light which is wavelength-converted by the second phosphor and is equal to or less than peak wavelength of light which is wavelength-converted by the fourth phosphor.

* * * * *